United States Patent
Jensen

(10) Patent No.: US 6,603,080 B2
(45) Date of Patent: Aug. 5, 2003

(54) CIRCUIT BOARD HAVING FERRITE POWDER CONTAINING LAYER

(75) Inventor: Stephen Jensen, Towson, MD (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 09/966,553

(22) Filed: Sep. 27, 2001

(65) Prior Publication Data

US 2003/0062965 A1 Apr. 3, 2003

(51) Int. Cl.[7] ................................................. H05K 1/03
(52) U.S. Cl. .................... 174/255; 174/256; 174/257; 174/262; 333/12
(58) Field of Search .................. 174/36, 254, 256, 174/257, 258, 255, 261, 262, 250; 333/12

(56) References Cited

U.S. PATENT DOCUMENTS

| | | |
|---|---|---|
| 4,801,489 A | 1/1989 | Nakagawa et al. |
| 4,970,354 A | 11/1990 | Iwasa et al. |
| 4,987,009 A | 1/1991 | Nakamura et al. |
| 5,025,211 A * | 6/1991 | Craft et al. ............... 324/158.1 |
| 5,073,840 A | 12/1991 | Coors |
| 5,177,324 A | 1/1993 | Carr et al. |
| 5,416,667 A * | 5/1995 | Ichikawa et al. ............ 361/816 |
| 5,594,397 A * | 1/1997 | Uchikoba et al. .............. 33/202 |
| 5,801,597 A * | 9/1998 | Carter et al. .................... 333/12 |
| 5,900,796 A * | 5/1999 | Parker .......................... 336/92 |
| 5,905,417 A * | 5/1999 | Norte et al. ................. 333/185 |
| 6,110,563 A | 8/2000 | Pienimaa et al. |
| 6,125,044 A * | 9/2000 | Cherniski et al. ............ 361/799 |
| 6,167,949 B1 * | 1/2001 | Langley et al. ......... 165/104.33 |
| 6,180,226 B1 | 1/2001 | McArdle et al. |

FOREIGN PATENT DOCUMENTS

| | | | |
|---|---|---|---|
| EP | 0691 660 A1 | 10/1996 | ............ H01B/1/22 |
| JP | 401030296 A * | 2/1989 | |
| JP | 402076295 A * | 3/1990 | |
| JP | 403255698 A * | 11/1991 | |
| JP | 410022683 A * | 1/1998 | |
| JP | 02001008439 A * | 1/2001 | |

* cited by examiner

*Primary Examiner*—Kamand Cuneo
*Assistant Examiner*—J B Patel
(74) *Attorney, Agent, or Firm*—Welsh & Katz, Ltd.

(57) ABSTRACT

A circuit board of the present invention is adapted to suppress electromagnetic interference. Such a circuit board comprises an electrically conductive transmission layer defining a circuit pattern, a ferrite layer comprising a ferrite powder spaced from the electrically conductive layer transmission layer, and an insulating layer, positioned between the transmission layer and the ferrite layer, wherein the insulating layer permits transmission of the electromagnetic interference through the insulating layer.

3 Claims, 6 Drawing Sheets

CIRCUIT BOARD HAVING FERRITE POWDER CONTAINING LAYER

FIELD OF THE INVENTION

This invention generally relates to structures and methods for the suppression of unwanted radio frequency and microwave signals on circuit boards, and more particularly to the use of a ferrite layer to couple with unwanted radio frequency and microwave signals in circuit boards.

BACKGROUND OF THE INVENTION

Circuit boards are used in a wide variety of electronic equipment such as radio and television sets, remote controls, calculators, telephones, cellular phones, personal computers, personal digital assistants, automobiles, manufacturing equipment, and many other applications where circuitry for electronic applications are needed. Printed circuit boards and flexible circuits are used in many applications because they are lightweight, inexpensive to produce, small, and readily produced in a uniform fashion in large numbers.

Printed circuit boards have one or more layers of wiring printed on respective layers of insulating material. Wiring can be present on two sides of a single layer of insulation with throughholes, eyelets or solid conducting connector. The wiring is often copper, but can also be any other conductive metal, and can be imparted by screening, vacuum deposition, plating and other techniques well known to those of ordinary skill in the art. The insulation can take a variety of forms such as resin and fiber laminate (prepreg), epoxy, ceramic, and plastic films such as polyimide films. The insulation that the circuit is printed on is often coated with another insulating layer to protect the circuitry. Circuit boards can have a number of other components either printed thereon or otherwise attached. Such components can be almost any type of electronic components and can include heat dissipating elements, integrated circuit chips, resistors, capacitors, inductors, transformers, diodes, transistors, oscillators, operational amplifiers, integrated amplifiers, power supplies, and voltage regulators to name but a few.

Some components on a circuit board can generate radio frequency ("RF"), with frequencies of less than about 30 MHz, or microwave signals, with frequencies of about 30 MHz up at least 300 GHz presently and up to at least 3,000 GHz in the future. These components on or near the circuit board will impart RF or microwave signals or both to the circuit board. Such signals can undesirably affect the operation of other components, devices, or systems on the circuit board or other nearby circuit boards, and as is often referred to as electromagnetic interference (EMI). Electromagnetic interference problems can be particularly insidious as parts that appear innocuous act as resonant circuits and have enormous effective cross-sections for pickup of external electromagnetic signals. Horowitz & Hill, *The Art of Electronics*, p. 457 (Cambridge University Press 2d. ed. 1980). The increasing use of microwave signals in communications makes microwave interference more common with time.

Accordingly, many electronic devices, such as transmitters, receivers, amplifiers and the like require some method of stripping unwanted RF and microwave signals from power and signal processing circuitry present on circuit boards. In the past, one approach for accomplishing this on circuit boards uses of lumped element ferrite beads and/or toroids made from lumps of ferrite. Such lumped ferrite elements can be costly to purchase and assemble on the finished circuit board. Additionally, lumped elements may not be entirely effective in suppressing unwanted EMI. First, the suppression is only effective in the immediate vicinity of the lumped ferrite element. Second, effective lumped elements can be large in comparison to space available on a circuit board or the distance available for installation.

Further, correctly suppressing unwanted EMI with lumped ferrite elements can be difficult. Often during the development of a circuit board product, small changes can be made. Such small changes to the design of a circuit board can have unpredictably large changes in the effectiveness of the suppression offered by the lumped ferrite element. These unexpectedly large changes in the effectiveness of the suppression can result in long and expensive development cycles for products.

Another method for protecting sensitive components uses a metal, such as copper or silver, to shield portions of a printed circuit board from other portions of a printed circuit board. Such methods often reflect radio frequency or microwave radiation rather than absorb it. Structures implemented in accordance with such methods can act as waveguides for radio or microwave radiation and exacerbate problems in the radio frequency or microwave spectra rather than solve problems related to electromagnetic interference. To the extent such methods succeed, the methods require the absorbing metal to be grounded to a sink to draw the electromagnetic radiation away——the metals themselves do not dissipate unwanted signals.

Accordingly, there exists a need for technology that permits the effective suppression of unwanted RF and microwave signals on circuit boards. Desirably, such technology will have inexpensive components. It is also advantageous that such technology not present difficulties in locating components on the printed circuit board. Even more desirably, such a technology will be easily implemented so that small alterations to the design of a printed circuit board do not require time consuming and expensive troubleshooting and/or redesign of the printed circuit board. Such methods will not provide structures that act as wave guides for the unwanted signals, and will not require further components or grounding to protect sensitive components from electromagnetic interference.

BRIEF DESCRIPTION OF THE DRAWINGS

The benefits and advantages of the present invention will become more readily apparent to those of ordinary skill in the relevant art after reviewing the following detailed description and accompanying drawings.

DETAILED DESCRIPTION OF THE INVENTION

Figure 1:
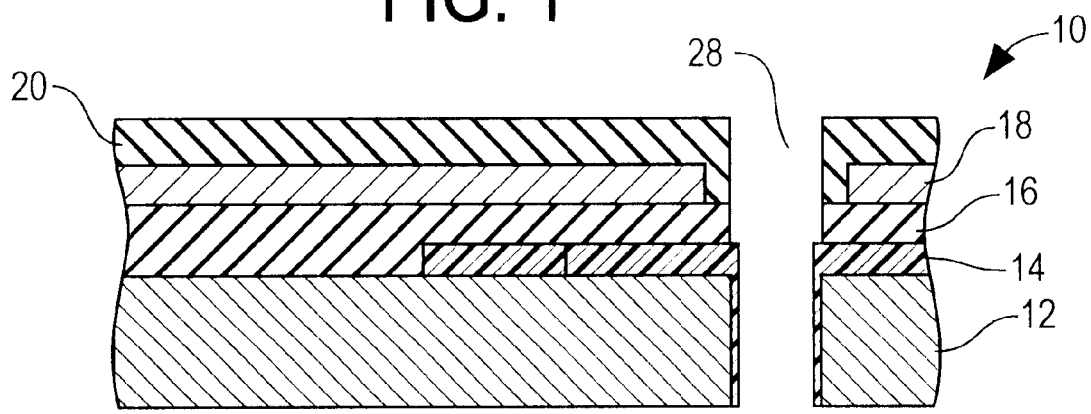
FIG. 1 is a cross sectional diagram of a first configuration of a circuit board of the present invention.

While the present invention is susceptible of embodiment in various forms, there is shown in the drawings and will hereinafter be described presently preferred embodiments with the understanding that the present disclosure is to be considered an exemplification of the invention and is not intended to limit the invention to the specific embodiments illustrated.

The invention is comprised of several sub-parts that serve a portion of the total functionality of the invention independently and contribute to system level functionality when combined with other parts of the invention.

In this written description, the use of the disjunctive is intended to include the conjunctive. The use of definite or indefinite articles is not intended to indicate cardinality. In particular, a reference to "the" object or thing or "an" objection or "a" thing is intended to also describe a plurality of such objects or things.

It is to be further understood that the title of this section of the specification, namely, "Detailed Description of the Invention" relates to a rule of the United States Patent and Trademark Office, and is not intended to, does not imply, nor should be inferred to limit the subject matter disclosed herein or the scope of the invention.

Figure 2:
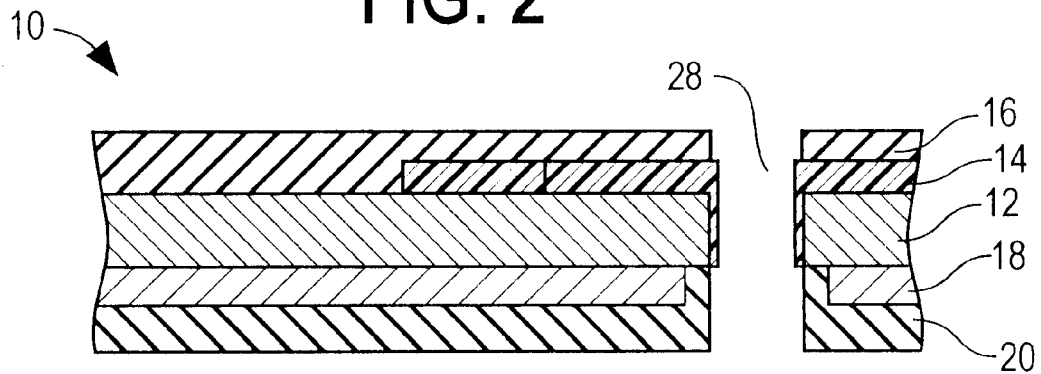
FIG. 2 is a cross-sectional diagram of a second configuration of a circuit board of the present invention.

Referring to the figures in general and FIGS. 1–2 in particular, circuit boards 10 embodying the present invention are illustrated. FIGS. 1–2 illustrate two embodiments of the present invention. The illustrated circuit boards 10 comprise an insulating substrate 12, a transmission layer 14, an insulating layer 16, a ferrite-containing layer 18, and a captivating layer 20.

Circuit boards 10 of the present invention can be printed circuit boards having one or more layers of wiring printed on respective layers of insulating material. A circuit board 10 can, as a whole, be rigid or semi-rigid. For example, circuit boards of the present invention can be made of prepreg as is common in computer manufacture, or of ceramic as can be common in the automotive industry. Circuit boards 10 of the present invention can also be flexible circuits where wiring is applied to, painted on, printed on, or otherwise present on plastic, paper or other flexible material. A circuit board 10 of the present invention can have a number of other components either printed, applied, or formed thereon or otherwise attached. Such components can be almost any type of electronic components and can include heat dissipating elements, integrated circuit chips, resistors, capacitors, inductors, transformers, diodes, transistors, oscillators, operational amplifiers, integrated amplifiers, power supplies, and voltage regulators to name but a few. Circuit board 10 of the present invention can be planar, or in the case of flexible circuit boards, be adaptable to a planar configuration.

The substrate 12 can be made from an electrically insulating dielectric material such as plastic, ceramic, microwave dielectric, ceramic-filled PTFE and the like and combinations thereof. A preferred substrate 12 material is prepreg. The substrate 12 can be rigid or flexible depending on the composition and thickness of the substrate. The substrate 12 can permit the transmission of electromagnetic radiation, signals, or waves , and radio frequency and microwave signals in particular. A preferred embodiment of the present invention has a dielectric layer comprising generally rigid prepreg formed in a thin rectangular block. Suitable material for the substrate 12 is provided by Arlon through its Electronic Substrates Division at 9433 Hyssop Drive Rancho Cucamonga, Calif. 91730.

Another preferred embodiment uses microwave circuit board material for the substrate 12. Such material is sold by Rogers Corporation, One Technology Drive, PO Box 188, Rogers, Conn. 06263-0188, under the ROGERS brand having part numbers RO3003, RO3203, RO3006, RO3210, RO4350, RT5880, RT5870, RT6010, as well as a number of other unlisted part numbers that may be suitable for use in the present invention. Arlon Microwave Materials Division, 1100 Governor Lea Road Bear, Del. 19701, provides substrates such as 35 NQ polyimide quarts, 85 NT polyimide/thermount, and 45 KN multifunctional epoxy/kevlar materials that are suitable for use with the present invention.

The substrate 12 can have eyelets, throughholes, or vias 28 formed therein or defined thereby to permit electronic components to or electrical leads therefor to pass through the substrate 12. Such openings can facilitate fixedly mounting electronic components, with methods known to those of ordinary skill in the art, including, but not limited to soldering.

Figure 3A:
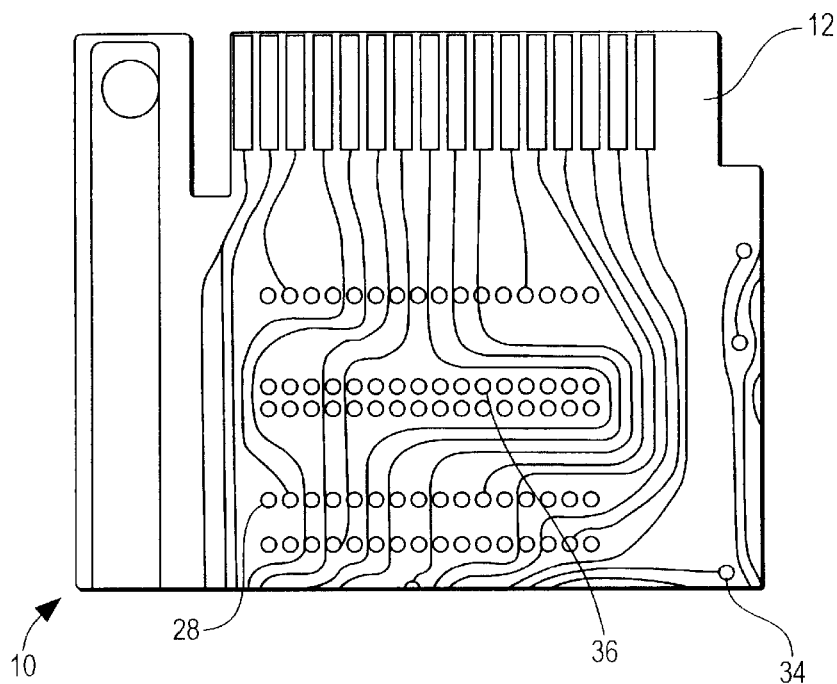
FIGS. 3A–B are first and second sides of a printed wiring board.
Figure 3B:
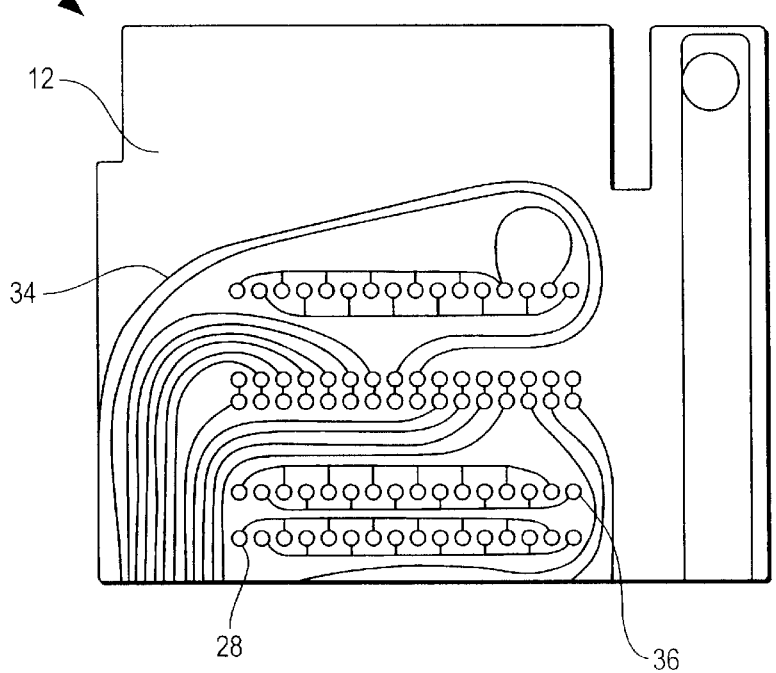

The transmission layer 14 is on the substrate 12. The transmission layer 14 can have one or more transmission lines 34 defining a circuit pattern 36. Those of ordinary skill in the art will understand that the transmission layer 14 will have properties commensurate with the aggregation of transmission lines that comprise it. Transmission lines 34 include, but are not limited to wires, signal conductors, and the like as those of ordinary skill will understand. Referring to FIGS. 3A–B, a circuit board 10 in the form of a printed wiring board having two sides is shown. The circuit board 10 has a plurality of transmission lines 34 that lead from edge connections to throughholes 28. As shown in FIGS. 3A–B, the transmission layer 14 can be a plurality transmission lines 34 that are present in almost every section of the circuit board 10.

A transmission line 34 can be made of a wide variety of electrically conductive materials including, but not limited to, copper, silver, gold, and brass, nickel, tin, solder and combinations of these and other materials. Copper is the preferred material for transmission lines 34 or layers 14. The transmission lines 34 or layers 14 can be vapor deposited, electrochemically deposited, laminated on, screened on, or use other techniques known to those of ordinary skill in the art.

Figure 4:
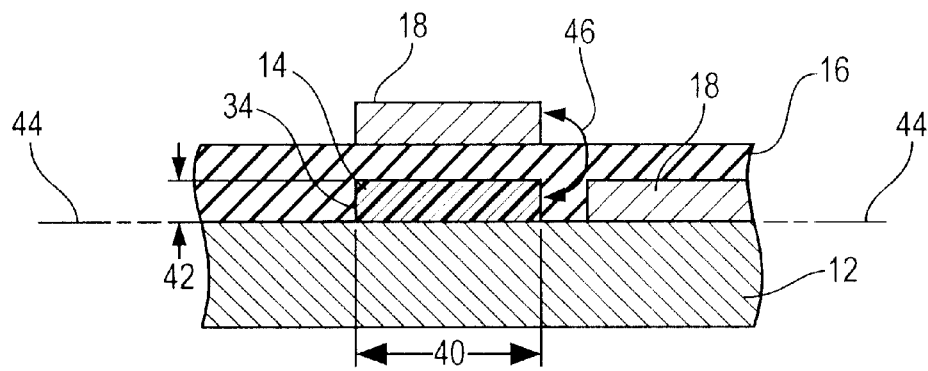
FIG. 4 is a cross-sectional illustration of the positional relationships between the ferrite containing layer and the transmission layer of the present invention.

Referring to FIG. 4, transmission lines 34 on printed circuit boards 10 can have a width 40 and a height 42. The width 40 is in the plane 44 of the substrate 12, and the height 42 is in a direction transverse to the substrate 12. If height 42 and width 40 of the transmission line 34 are not equal, the larger of the two is referred to as the broad side of the transmission line, and coupling across the larger dimension 46 is referred to as broad side coupling. The transmission lines 34 are electrically conductive so as to be able to conduct electrical signals. Transmission lines 34 can, but do not necessarily, conduct electromagnetic signals, with electromagnetic signals traveling at the speed of light for the medium traversed including one or more frequencies or wavelengths. Electromagnetic signals include, but are not limited to, radio frequency and microwave radiation.

The transmission lines 34 can be connected to other transmission lines 34 or electronic components through the eyelets, throughholes, or vias 28 formed in the substrate layer 12.

Referring back to FIG. 1 an insulating layer 16 can be positioned between the transmission layer 14 and the ferrite containing layer (or ferrite layer). 18 Alternatively, as shown in FIG. 2, the insulating layer 16 can be positioned opposite the substrate 12 on the transmission layer 14. The insulating layer 16 can contact, or be on, the transmission line 34 or layer 14. In addition to the materials suitable for the substrate 12, the insulating layer 16 can also be material that is incapable of supporting the transmission lines 34, such as solder flux or paint. The insulating layer 16 insulates the transmission layer 14 to maintain the electrical signal in the transmission layer 14. The insulating layer 16 can permit some or all electromagnetic signals, including electromagnetic signals that are present in transmission lines 34, to travel from the transmission layer 14 or line 34 to the ferrite containing layer 18.

A circuit board 10 of the present invention can use a captivating layer 20. The captivating layer 20 can be used to secure the ferrite containing layer 18 to the circuit board 10. In FIG. 1, the captivating layer 20 maintains the ferrite containing layer 18 on the insulating layer 16. In FIG. 2, the captivating layer 20 maintains the ferrite containing layer 18 on the insulating layer 16. The captivating layer 20 can also be used to protect the ferrite containing layer 18 from environmental conditions that could degrade the ferrite containing layer 18 or the ferrite containing layer's continued contact with or adhesion to the circuit board 10. The use of a captivating layer 20 can be desirable when the ferrite containing layer comprises 18 a powder or when it is desirable to secure the ferrite containing layer 18. For example, the ferrite containing layer 18 could comprise a brittle epoxy that, although secure initially, can crack and or flake under hot and humid conditions.

Figure 5:
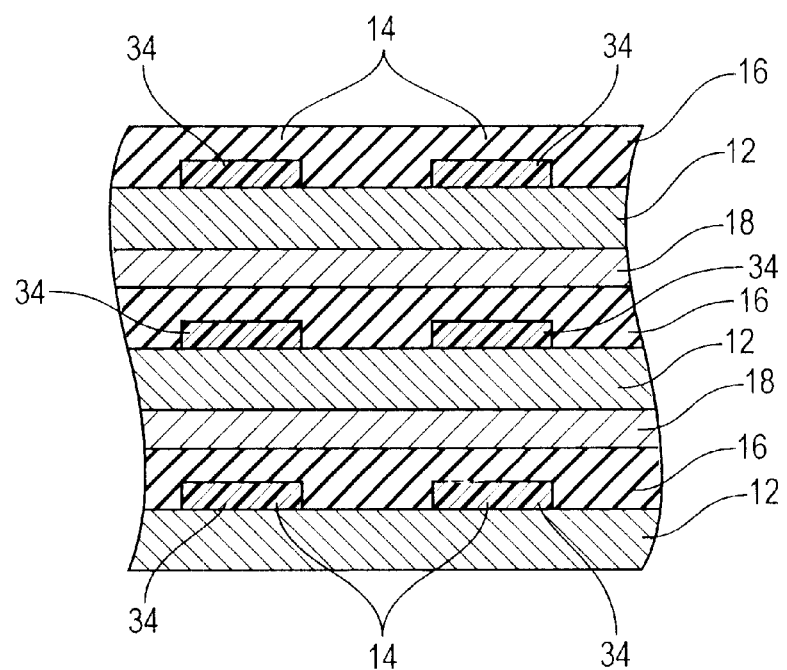
FIG. 5 is a cross-sectional diagram of a multilayer circuit board of the present invention.
Figure 6A:
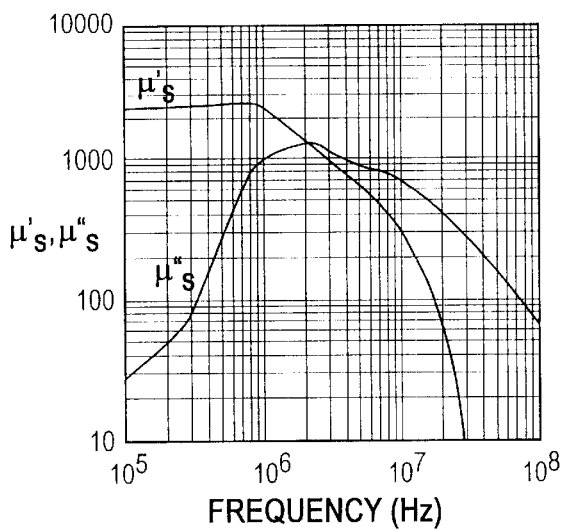
FIGS. 6A–E are graphs of the complex permeability of five different ferrites suitable for use in the present invention.
Figure 6B:
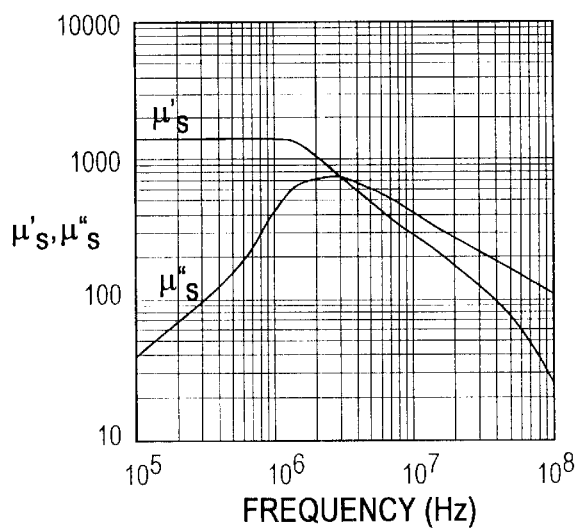
Figure 6C:
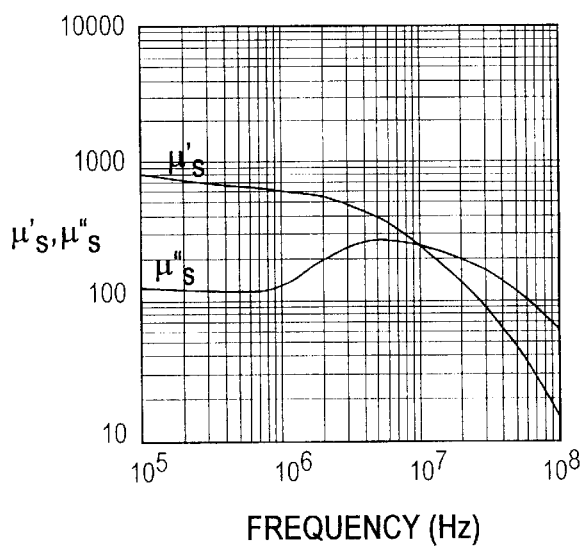
Figure 6D:
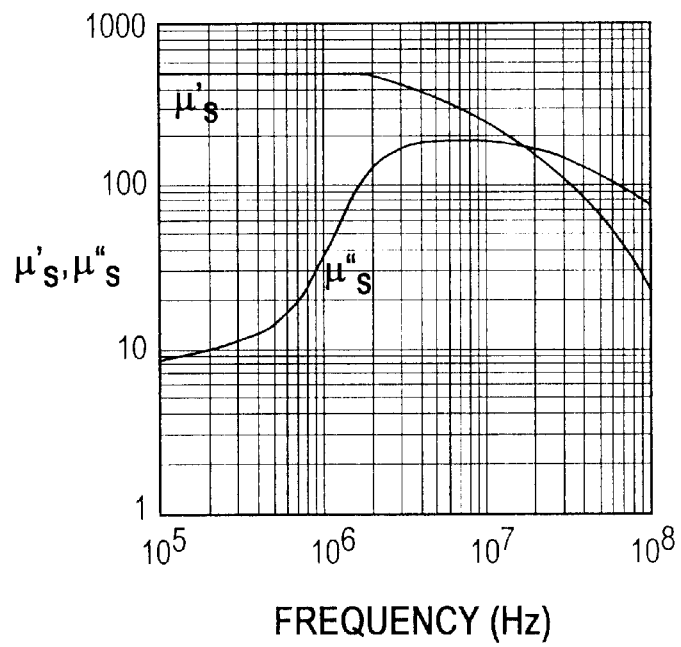
Figure 6E:
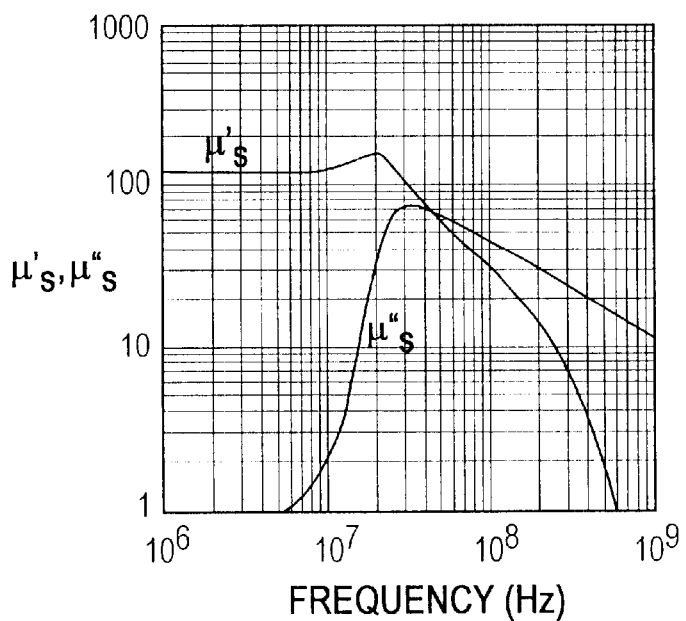

Referring to FIG. 5, a circuit board 10 of the present invention can be a multi-layer circuit board. Such a circuit board 10 can have a plurality of substrates 12, insulating layers 14, ferrite containing layers 18, and captivating layers 20. A single transmission layer 14 or line 34 can accordingly, have more than one ferrite containing layer 18 nearby to absorb interfering electromagnetic signals known as electromagnetic interference.

Ferrites can be characterized by well-known properties such as permeability ($\mu$), flux density (B), and loss factor ($\delta$). The permeability of ferrites can be expressed as a complex parameter having a real part ($\mu'_s$) and an imaginary ($\mu''_s$) part. The real part of the permeability relates to the loss-free inductor character of the ferrite, while the imaginary part of the permeability relates to the equivalent loss resistor character of the ferrite. The real and imaginary parts of the permeability are related to the impedance (Z) of the ferrite as follows:

$$Z = i\omega L_s + R_s = i\omega L_0(\mu'_s - i\mu''_s) \text{ ohm}$$

so that $$\omega L_s = \omega L_0 \mu'_s \text{ ohm (real part, loss-free inductor)}$$

and $$R_s = \omega L_0 \mu''_s \text{ ohm (imaginary part, equivalent loss resistor)}$$

where Lo is the air core inductance.

The relationship between the inductance and the resistance defines the loss factor 6 by the equation:

$$\tan\delta = \frac{R_s}{\omega L_s} = \frac{\mu''_s}{\mu'_s}$$

As can be seen in the curves in FIGS. 6A–E, an individual ferrite material can have the ratio of the real component to the imaginary component vary significantly over a range of frequencies, and differ significantly from other ferrite materials. As will be understood by those of ordinary skill in the art, the loss factor of the individual ferrite material will accordingly vary with frequency. Ferrite can be selected for use in the present invention based on the strength of the imaginary component of permeability at the frequency of electromagnetic interference to be suppressed. Materials having an imaginary permeability $\mu''_s$ of about 10 or greater can be used. Materials with an imaginary permeability of greater than about 100 are preferred.

The ferrite containing layer 18 of the present invention can operate by dissipating electromagnetic interference by absorbing an electromagnetic signal and transforming the electromagnetic signal into heat or non-interfering electromagnetic energies. The electromagnetic interference absorbed can emanate from the circuit board 10 or from the environment. Thus, the present invention can protect a circuit board 10 and neighboring boards from electromagnetic interference generated on the circuit board 10, or can protect a circuit board 10 from electromagnetic interference from outside the circuit board.

One embodiment of the present invention uses ferrite to absorb radio frequency and microwave frequency signals. Such dissipation can have the advantage of not requiring the grounding of the electromagnetic interference. Accordingly, the ferrite layer 18 of the present invention is not required to be connected to a ground or grounding conductor. Those of ordinary skill in the art will appreciate that a metallic layer that can serve as a shield for some electromagnetic energies can actually serve as a waveguide for microwave signals. One further advantage of the present invention is that ferrite that absorbs and dissipates the electromagnetic signal will not act as a waveguide for the electromagnetic signal.

One way those of skill in the art express how much of an electromagnetic signal is dissipated rather than conducted by a material is by the loss factor of the material. Ferrite material suitable for use in the present invention can have a loss factor of more than about 0.0001 for at least one frequency. Some embodiments of the present invention use ferrite material that has a loss factor of more than about 0.00025 for at least one frequency. Other embodiments of the present invention use ferrite that can have a loss factor of more than 0.0005.

Preferably, the ferrite used in the present invention has a high flux density. Ferrite having a flux density of more than about 2000 gauss can be used. Ferrite having a flux density of more than 2700 can also be used.

The ferrite containing layer 18 comprises one or more ferrites, which are magnetic oxides. Ferrites suitable for use in the present invention are available from Fair-Rite Products Corp. of Wallkill, N.Y. or Ceramic Powders Inc. of Joliet, Ill. Ferrite can be of the formula $MFe_2O_4$ where M can be one or more of magnesium, manganese, iron, cobalt, nickel, copper, zinc, and cadmium. Both NiZn and MnZn ferrites can be used for the present invention. As will be appreciated by those of ordinary skill in the art, various ferrite materials can couple more strongly to electromagnetic interferences of various frequencies. Referring to TABLE 1, and FIGS. 5A–E, are the complex permeability vs. frequency curves for five ferrites available from Fair-Rite Products Corp.

TABLE 1

| Figure of Curve | Ferrite Type | Frequency Range | Manufacturer's Designation |
| --- | --- | --- | --- |
| FIG. 5A | MnZn | 1–25 MHz | Type 73 |
| FIG. 5B | MnZn | 1–300 MHz | Type 31 |
| FIG. 5C | NiZn | 20–300 MHz | Type 43 |
| FIG. 5D | NiZn | 20–300 MHz | Type 44 |
| FIG. 5E | NiZn | 200+ MHz | Type 61 |

The ferrite powder may be wholly or partially one or more ferrites. A particular circuit board 10 may be subject to electromagnetic interference at one or more frequencies or frequency ranges. Of particular concern is interference in the radio frequency and microwave portions of the electromagnetic spectrum. Such electromagnetic signals have frequencies and wavelengths that span several orders of magnitude.

Accordingly, the ferrite containing layer 18 can comprise two or more ferrite-containing materials. For example, two ferrite-containing materials can be selected to cover a wide, continuous range of frequencies. Such coverage could be provided by a mixture of Type 43 ferrite, having desirable properties in the range of about 20 MHz to about 200 MHz, and Type 61 ferrite from Fair-Rite Products Corp., having desirable properties in the range of about 200 MHz, and Type 61 ferrite from Fair-Rite Products Corp., having desirable properties for higher frequencies. Alternatively, MnZn ferrite, such as type 73, could be used to cover frequencies near 1 MHz and Type 43 ferrite can be used to cover 20 MHz to 200 MHz. In another embodiment, frequencies from about 1 MHz to 25 MHz could be covered using Type 73 ferrite, and frequencies above 200 MHz covered using Type 61 ferrite.

The ferrite containing layer 18 can be a ferrite-containing medium that is wholly ferrite-containing material or partly ferrite-containing material. The ferrite containing layer 18 comprises a ferrite powder comprising one or more types of solid particles comprising one or more ferrites each. The ferrite powder can be pulverized from macroscopic chunks of ferrite, or can be obtained in an already powdered form. For example, suitable ferrite powder can be obtained by breaking a ferrite toroid of Type 43 with a vise into pieces, and then further breaking those pieces into powder with a hammer. In another example, ferrite powder screened to have particles larger than 5 microns ($\mu$m) and less than 10 microns can be obtained commercially.

The ferrite powder can be present with or without additional materials. The ferrite powder can be adhered to, admixed with, or be a component of a paint, plastic or epoxy or other adhesive or adhesive-containing material. The ferrite powder can be distributed randomly within a medium, or the ferrite particles can be ordered. An effective thickness of the ferrite layer is the thickness that the layer would have if the layer was made only of ferrite. An actual thickness of a ferrite containing layer 18 is the actual dimension of the material that contains the quantity of ferrite. The ferrite percentage of the ferrite containing layer 18, or portion thereof, is the effective thickness of the ferrite layer divided by the actual thickness the layer or portion thereof.

Ferrite can be as little as about five percent of the ferrite containing layer 18 and can be as much as about one hundred percent of the ferrite containing layer 18. Preferably, one or more ferrites comprise more than ten percent of the ferrite layer. The effective ferrite layer thickness can be more than about 0.0005" thick, and can be less than about 0.06" thick. The effective thickness of the ferrite containing layer 18 can be less if the associated transmission line 34 is long and the ferrite containing layer is near the transmission line for a substantial length of the transmission line. The ferrite percentage can be greater if the length of the transmission line 34 is short and therefore the ferrite layer is near the transmission line 34 for only a short distance, the protection needed is great, or the frequency of the electromagnetic interference is not one that the ferrite or ferrites being used is particularly effective at dissipating. The thickness of the ferrite containing layer 18 can be limited by the necessity of positioning the ferrite close enough to the transmission lines 34 to magnetically couple with the electromagnetic signals.

Referring again to FIGS. 1–2, the ferrite containing layer 18 is spaced from the transmission layer 14. In FIG. 1, the insulating layer 16 is present between the transmission layer 14 and the ferrite containing layer 18 so that electrical signals present in the transmission layer 14 or lines 34 are effectively isolated from the ferrite containing layer 18. As illustrated in FIG. 1, the ferrite containing layer 18 can be in contact with the insulating layer 16, and can be spaced from the transmission layer 14 or lines 34 by the insulating layer 16. In FIG. 2, the substrate 12 spaces the transmission layer 14 from the ferrite containing layer 18. In one embodiment of the present invention, the layer or layers that space the ferrite containing layer 18 from the transmission layer 14 permit the transmission of electromagnetic signals, including radio frequency and microwave signals, through such layers.

As shown in FIGS. 1–2, the ferrite containing layer 18 can define throughholes, eyelets, or vias 28 to permit leads for electronic components or electronic components themselves to pass through the ferrite containing layer 18 without contacting the ferrite containing layer. Such a configuration of the ferrite containing layer 18 can be desirable for use with printed wiring boards or hybrid circuit boards. The vias, throughholes or eyelets 28 can facilitate the insertion of electronic components or leads for electronic components as well as the attachment of same through soldering or other means.

Alternatively, referring to FIG. 5, the ferrite containing layer 18 can be a continuous layer in a circuit board 10 The continuous ferrite containing layer 18 can be above or below the transmission layer 14. Such a configuration can be most practical when electronic components are not included on the circuit board 10 so that the electrical leads of the components contact the ferrite containing layer 18. An example of a situation in which a continuous configuration of the ferrite containing layer 18 can be desirable is when the circuit board 10 comprises all of the electronic components present in the transmission layer 14 such as in a flexible circuit having its electronic components formed in the transmission layer or in a series of transmission layers by masks and etching of various vapor deposited and electrode-posited metals.

Figure 7:
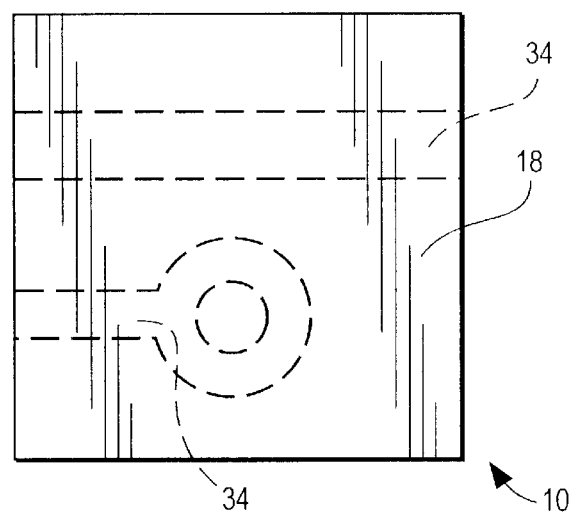
FIG. 7 is an illustration of a circuit board of the present invention having a continuous ferrite containing layer.
Figure 8:
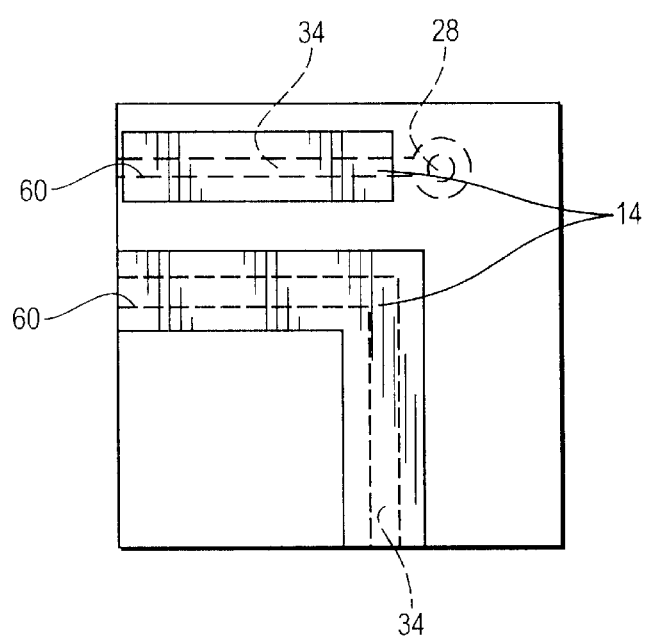
FIG. 8 is an illustration of a circuit board of the present invention having ferrite layer regions.

In another alternate embodiment illustrated in FIG. 7, the ferrite layer 18 can be present in a plurality of ferrite containing layer regions 60 near some or all of the transmission lines 34 of the circuit board 10. The regions 60 can be spaced apart from each other. As illustrated in FIG. 7, the ferrite layer regions are located above the transmission lines. As illustrated in FIG. 4, the ferrite layer regions 60 can be disposed above the wider dimension 40 of the transmission line 34 so that the elements have their broader sides facing each other so that broadside coupling can occur between the ferrite containing layer 18 and the transmission layer 14 or lines 34. Another embodiment of the invention has the ferrite layer regions 60 in the same plane as the transmission layer 14, but beside a transmission line 34 or between transmission lines.

The present invention contemplates a method of making a circuit board 10 having a ferrite containing layer 18 using a screening process. First, a circuit board 10 having the transmission layer 14 on the substrate 10 with the insulating layer 16 on the transmission layer can be provided. Standard circuit boards such as printed wiring boards, printed circuit boards, or flexible circuit laminates can be used. Many such boards and variations thereon are known to those of ordinary skill in the art, and are contemplated by the present invention.

The method further comprises providing an image mask embodying the desired configuration of the ferrite layer 18. As discussed above, the ferrite layer 18 can be complete or partial, and can be continuous or have a plurality of ferrite layer regions 60. The desired ferrite configuration can define voids for permitting the final circuit board of the present invention to have vias, throughholes, or eyeholes 28. The desired ferrite pattern can also be designed to avoid components already mounted on or in the circuit board 10. For example, the left half of a circuit board 10 can be coated with a ferrite layer 18, while the right half is not coated.

The image mask defines openings that will be the locations where the ferrite layer 18 is to be deposited. Preferably, the image mask can have a thickness equal to the thickness of the desired ferrite layer 18. Desirably, the thickness of the mask controls the thickness of the final ferrite layer 18.

Then, the mask is placed over the circuit board 10. A ferrite material, as described above, is provided. The material can be powder, paint, or other form of ferrite material that is spreadable. Next, the material is spread or screened across the image mask such that the ferrite material contacts the circuit board 10. Preferably, the ferrite material substantially fills, but does not significantly overfill, the openings. Then the material can be allowed to set or dry if needed. A captivating layer 20 can then be applied. Applying the captivating layer can be done by many methods known to those of ordinary skill in the art, including painting over ferrite containing layer 18 or applying solder flux to the ferrite containing layer.

Referring back to FIG. 5, in another embodiment of the invention, a multi-layer circuit board 10 is provided. A ferrite layer 18 is screened onto a circuit board 10 having one or more layers. Then a prepreg layer, optionally having additional circuitry, is placed over the ferrite layer 18. The whole assembly subjected to appropriate heat and pressure to form a new, unitary circuit board 10. This process can be repeated a number of times.

In a further embodiment of the present invention, the circuit board 10 provided can have depressions formed or milled therein to accept the ferrite layer 18. The ferrite layer 18 can then optionally be captivated with a captivating layer 20 or be composed of materials that adhere to the circuit board 20.

In a still further embodiment of the present invention, a captivating layer 20 can be molded to define a plurality of depressions. An example is to form prepreg in a mold having a negative of the desired ferrite layer configuration. Ferrite-containing material can then be screened into the depressions. The captivating layer 20 can then be adhered to the circuit board 10 to captivate the ferrite layer 18 to the circuit board. To continue the example, the prepreg board with the screened-in ferrite material can be contacted with a circuit board 10 comprising a prepreg substrate, and the two can be fused with heat and pressure in methods well known to those of ordinary skill in the art.

From the foregoing it will be observed that numerous modifications and variations can be effectuated without departing from the true spirit and scope of the novel concepts of the present invention. It is to be understood that no limitation with respect to the specific embodiment illustrated is intended or should be inferred. The disclosure is intended to cover by the appended claims all such modifications as fall within the scope of the claims.

What is claimed is:

1. A circuit board adapted to suppress electromagnetic interference, the circuit board comprising:

an electrically conductive transmission layer defining a circuit pattern;

a ferrite powder containing medium consisting essentially of a ferrite powder spaced from the electrically conductive transmission layer where the medium has an effective thickness of greater than about 0.0005 inches and less than about 0.06 inches has a loss factor of greater than 0.0001;

an insulating layer, positioned between the transmission layer and the ferrite powder containing medium, wherein the ferrite powder containing medium is configured to magnetically couple to an electromagnetic signal in the transmission layer where the electromagnetic signal is more than about 1 MHz and less than about 300 GHz.

2. A circuit board adapted to suppress electromagnetic interference, the circuit board comprising:

an electrically conductive transmission layer defining a circuit pattern;

a ferrite powder containing medium spaced from the electrically conductive transmission layer wherein the ferrite powder has a particle size of greater than about six tenths of a micron and less than about ten microns and has an imaginary component of a complex permeability of more than about 10, and the ferrite layer has an effective thickness of greater than about 0.0005 inches and less than about 0.06 inches has a loss factor of greater than 0.0001; and an insulating layer, positioned between the transmission layer and the ferrite powder containing medium, wherein the ferrite layer is configured to magnetically couple to an electromagnetic signal in the transmission layer where the electromagnetic signal is more than about 1 MHz and less than about 300 GHz.

3. A circuit board adapted to suppress electromagnetic interference, the circuit board comprising:

an electrically conductive transmission layer defining a circuit pattern;

a ferrite powder containing medium spaced from the electrically conductive transmission layer wherein the ferrite powder has a particle size of more than about 1 micron and less than about 5 microns and has an imaginary component of a complex permeability of more than about 100 for at least one frequency of more than about 20 MHz and less than about 1 GHz and wherein the ferrite powder has a flux density of at least about 2000 gauss, wherein the ferrite powder containing medium has an effective thickness of greater than about 0.005 inches and less than about 0.01 inches, and wherein the ferrite powder containing medium has a loss factor of greater than 0.0005; and an insulating layer, positioned between the transmission layer and the ferrite powder containing medium;

wherein the ferrite powder containing medium can magnetically couple to an electromagnetic signal in the transmission layer where the electromagnetic signal is more than about 20 MHz and less than about 1 GHz.

* * * * *